(12) United States Patent
Massoudi

(10) Patent No.: US 7,191,387 B1
(45) Date of Patent: Mar. 13, 2007

(54) METHOD AND APPARATUS FOR FORWARD ERROR CORRECTION

(75) Inventor: Firooz Massoudi, Santa Clara, CA (US)

(73) Assignee: Ikanos Communication Inc., Fremont, CA (US)

( * ) Notice: Subject to any disclaimer, the term of this patent is extended or adjusted under 35 U.S.C. 154(b) by 516 days.

(21) Appl. No.: 10/392,674

(22) Filed: Mar. 18, 2003

Related U.S. Application Data

(63) Continuation-in-part of application No. 10/346,394, filed on Jan. 15, 2003.

(60) Provisional application No. 60/349,062, filed on Jan. 15, 2002.

(51) Int. Cl.
*H03M 13/03* (2006.01)

(52) U.S. Cl. .................. 714/796; 714/791; 714/792; 375/261; 375/265; 375/269; 375/273

(58) Field of Classification Search ........ 714/791–792, 714/796, 786, 795, 755; 375/265, 262, 341, 375/261, 269, 273
See application file for complete search history.

(56) References Cited

U.S. PATENT DOCUMENTS

| | | | |
|---|---|---|---|
| 4,583,078 A * | 4/1986 | Shenoy et al. ................ 341/51 |
| 5,497,401 A | 3/1996 | Ramaswamy et al. | |
| 5,537,445 A | 7/1996 | Blaker et al. | |
| 5,802,115 A | 9/1998 | Meyer | |
| 5,949,796 A * | 9/1999 | Kumar ....................... 370/529 |
| 5,983,383 A | 11/1999 | Wolf | |
| 5,996,112 A | 11/1999 | Dabiri et al. | |
| 6,088,404 A * | 7/2000 | Jekal ........................... 375/341 |
| 6,272,661 B1 * | 8/2001 | Yamaguchi ................. 714/795 |
| 6,327,317 B1 * | 12/2001 | Chennakeshu et al. ..... 375/341 |
| 6,477,680 B2 * | 11/2002 | Mujtaba ..................... 714/795 |
| 6,690,739 B1 * | 2/2004 | Mui ........................... 375/265 |
| 2004/0158798 A1* | 8/2004 | Senda et al. ................ 714/792 |

* cited by examiner

*Primary Examiner*—Guy J. Lamarre
(74) *Attorney, Agent, or Firm*—IP Creators; Charles C Cary

(57) ABSTRACT

A convolutional decoder for a wired or wireless receiver receiving an encoded datastream. The branch and path metric components compute branch and path metrics for the encoded datastream stream. The traceback unit couples to the path metric component to trace in each traceback interval a single path through the path metrics to determine correction factors for decoding at least two corresponding successive sub-symbols/symbols from the encoded datastream in each traceback interval.

31 Claims, 10 Drawing Sheets

Encoder with "m=4" Maximul Memory Order

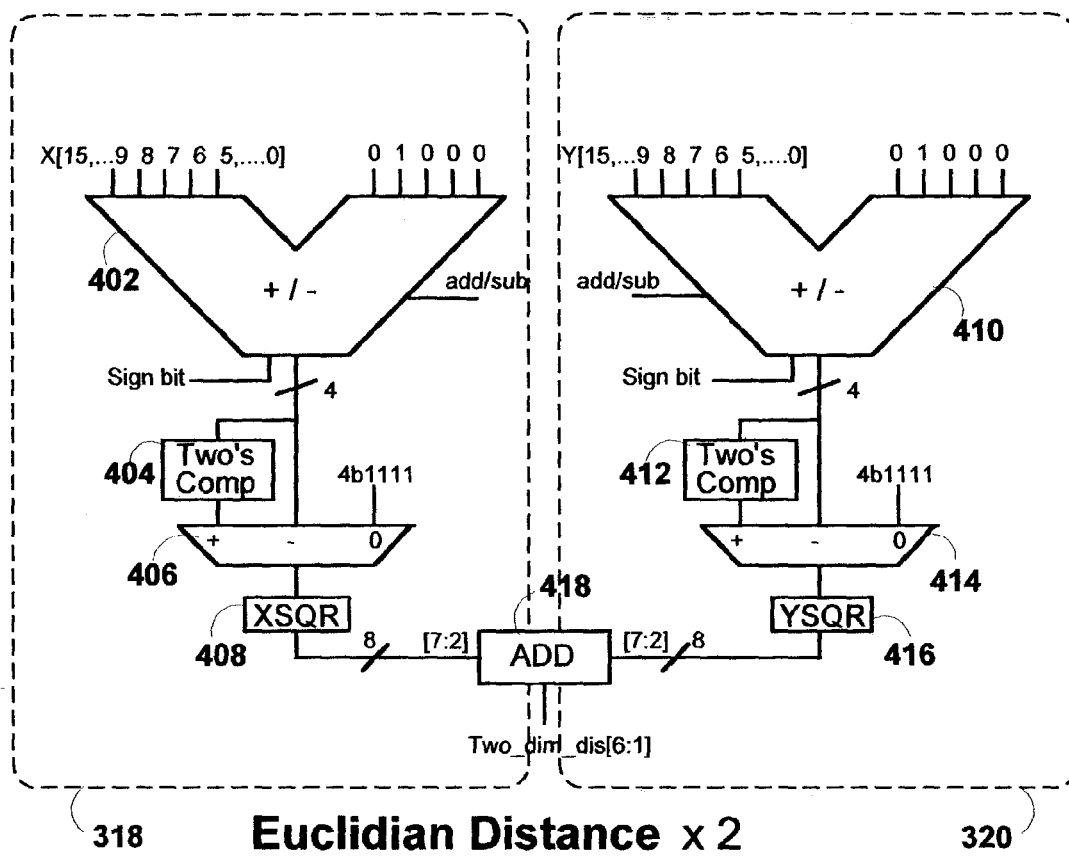
FIG. 4A Euclidian Distance x 2
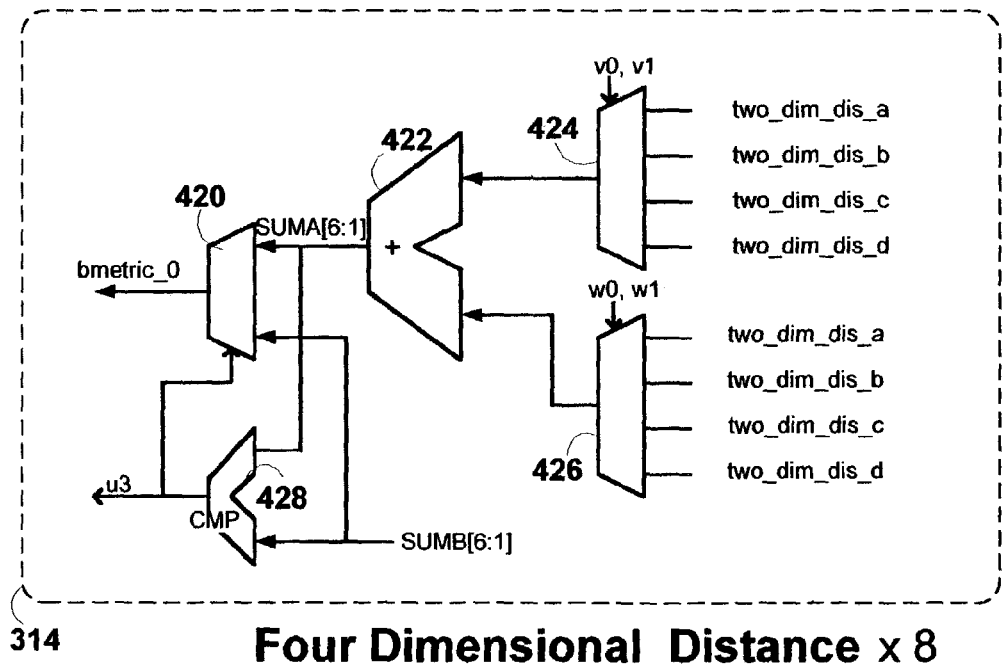
FIG. 4B Four Dimensional Distance x 8

| 4-D coset | $u_3$ $u_2$ $u_1$ $u_0$ | $v_1$ $v_0$ | $w_1$ $w_0$ | 2-D coset |
|---|---|---|---|---|
| $C_4^0$ | 0 0 0 0 | 0 0 | 0 0 | $C_2^0 \times C_2^0$ |
|  | 1 0 0 0 | 1 1 | 1 1 | $C_2^3 \times C_2^3$ |
| $C_4^4$ | 0 1 0 0 | 0 0 | 1 1 | $C_2^0 \times C_2^3$ |
|  | 1 1 0 0 | 1 1 | 0 0 | $C_2^3 \times C_2^0$ |
| $C_4^2$ | 0 0 1 0 | 1 0 | 1 0 | $C_2^2 \times C_2^2$ |
|  | 1 0 1 0 | 0 1 | 0 1 | $C_2^1 \times C_2^1$ |
| $C_4^6$ | 0 1 1 0 | 1 0 | 0 1 | $C_2^2 \times C_2^1$ |
|  | 1 1 1 0 | 0 1 | 1 0 | $C_2^1 \times C_2^2$ |
| $C_4^1$ | 0 0 0 1 | 0 0 | 1 0 | $C_2^0 \times C_2^2$ |
|  | 1 0 0 1 | 1 1 | 0 1 | $C_2^3 \times C_2^1$ |
| $C_4^5$ | 0 1 0 1 | 0 0 | 0 1 | $C_2^0 \times C_2^1$ |
|  | 1 1 0 1 | 1 1 | 0 1 | $C_2^3 \times C_2^2$ |
| $C_4^3$ | 0 0 1 1 | 1 0 | 0 0 | $C_2^2 \times C_2^0$ |
|  | 1 0 1 1 | 0 1 | 1 1 | $C_2^1 \times C_2^3$ |
| $C_4^7$ | 0 1 1 1 | 1 0 | 1 1 | $C_2^2 \times C_2^3$ |
|  | 1 1 1 1 | 0 1 | 0 0 | $C_2^1 \times C_2^0$ |

FIG. 5

METHOD AND APPARATUS FOR FORWARD ERROR CORRECTION

CROSS REFERENCE TO RELATED APPLICATION

This application is a continuation in part of prior filed co-pending application Ser. No. 10/346,394 entitled "Method and Apparatus for Forward Error Correction" filed on Jan. 15, 2003 which claims the benefit of prior filed Provisional Application No. 60/349,062 filed on Jan. 15, 2002 entitled "Viterbi decoder" which is incorporated herein by reference in its entirety as if fully set forth herein.

BACKGROUND OF THE INVENTION

1. Field of Invention

This invention relates generally to communications, and more particularly, to a method and apparatus for forward error correction of a convolution type.

2. Description of the Related Art

Digital communications over a wired or wireless communication medium are typically impaired by noise within the transmission bandwidth. Transmit power its typically limited by practical considerations and the transmit signal is attenuated by path loss, multi-path distortions, and various forms of cross-talk. Typically a digital communication system is designed for the worst case signal quality at which the receiver is to operate. This signal quality is measured as an energy to noise ratio and is determined by the transmit power, path loss, noise and interference. The minimum energy at which data communications may be reliably received is the system threshold level. At the threshold level the probability of error for any digital transmission modulation protocol can be calculated. To reduce the error in signal transmission the digital data is encoded before transmission and decoded at the receiver. The coding technique is determined by the requirements of the application and the channel characteristics. Coding allows for detection and correction of errors in the transmitted data at the expense of additional processing overhead and or a lower effective data rate. Two classes of coding, block and convolutional coding are utilized to decrease the probability for error. Reed-Solomon and Viterbi are common forms of block and convolutional coding respectively. A convolutional encoder encodes each input bit into code bits according to a set of generator polynomials. Each generator polynomial computes one code bit and the code bits are combined into a code branch. The constraint length, a.k.a. the maximul memory order, "m" of the encoder is the number of data bits used in the encoding process and determines the error correcting capability of the code. Long constraint lengths yield better performance at the expense of hardware and computational complexity. A state is designated by the m−1 prior input bits and there are $2^{m-1}$ states. A Viterbi algorithm is typically used to decode the transmitted code branches at the receiver. A Viterbi algorithm performs the maximum likelihood decoding of the transmitted data path. For each received code branch, the branch metric of all branches entering each state is computed and added to the corresponding prior path metrics and the best path entering each state is selected and stored as the new path metrics. Each Viterbi decoded bit is obtained by tracing a path back through the various path metrics to find the maximum likelihood path.

FEC techniques and in particular convolution encoding/decoding can be applied across a range of wired and wireless modulation protocols including: discrete multi-tone (DMT), carrierless AM/PM (CAP), quadrature amplitude modulation (QAM), quadrature phase amplitude modulation (QPAM), code division multiple access (CDMA), binary shift keying (BPSK), quaternary phase shift keying (QPSK), etc.

What is needed are computationally efficient methods and apparatus for reducing the complexity and increasing the throughput of convolutional encoders.

SUMMARY OF THE INVENTION

A method and apparatus for forward error correction is disclosed. It may be used with equal efficacy in convolutional decoders of receivers or transceivers implementing wired or wireless communications in a variety of modulation protocols including but not limited to: discrete multi-tone (DMT), carrierless AM/PM (CAP), quadrature amplitude modulation (QAM), quadrature phase amplitude modulation (QPAM), code division multiple access (CDMA), binary shift keying (BPSK), quaternary phase shift keying (QPSK), etc. The apparatus and method exhibit reduced computational complexity and increased throughput.

In an embodiment of the invention a convolutional decoder is disclosed for use in the receive path of a wired or wireless receiver receiving an encoded datastream. The convolutional decoder includes: branch and path metric components and a traceback unit. The branch and path metric components compute branch and path metrics for the encoded datastream stream. The traceback unit couples to the path metric component to trace in each traceback interval a single path through the path metrics to determine correction factors for decoding at least two corresponding successive sub-symbols/symbols from the encoded datastream.

In an alternate embodiment of the invention a pipelined Viterbi decoder for decoding a multi-tone modulated datastream encoded with convolutional encoder with a maximul memory order "m" is disclosed. The pipelined Viterbi decoder includes: a two-dimensional, four-dimensional and path metric components and a traceback component. The two-dimensional branch metric component accepts in each of successive pipeline processing intervals an input of a pair of tones and determining there from a quantity m two-dimensional branch metrics. The four-dimensional branch metric component couples to the two-dimensional branch metric component to determine in each successive pipeline processing interval a quantity 2m four-dimensional branch metrics from the m two-dimensional branch metrics. The path metric component couples to the four-dimensional branch metric component to determine in each successive pipeline processing interval a quantity $m^2$ path metrics from the 2m four-dimensional branch metrics. The traceback component couples to the path metric component to repetitively traceback through a succession of the path metrics provided by the path metric to determine correction factors for decoding corresponding ones of the tones.

BRIEF DESCRIPTION OF THE DRAWINGS

These and other features and advantages of the present invention will become more apparent to those skilled in the art from the following detailed description in conjunction with the appended drawings in which:

FIGS. 4A–D are detailed hardware block diagrams of an embodiment of the branch metric, path metric, and demapper components of the convolutional decoder shown in FIG. 3.

FIG. 5 is a table showing an embodiment of the Euclidian to four dimensional architectural layout for the branch metric portion of the convolutional decoder shown in FIG. 3 for a modulation protocol with a 64 point constellation.

DETAILED DESCRIPTION OF THE EMBODIMENTS

Figure 1:
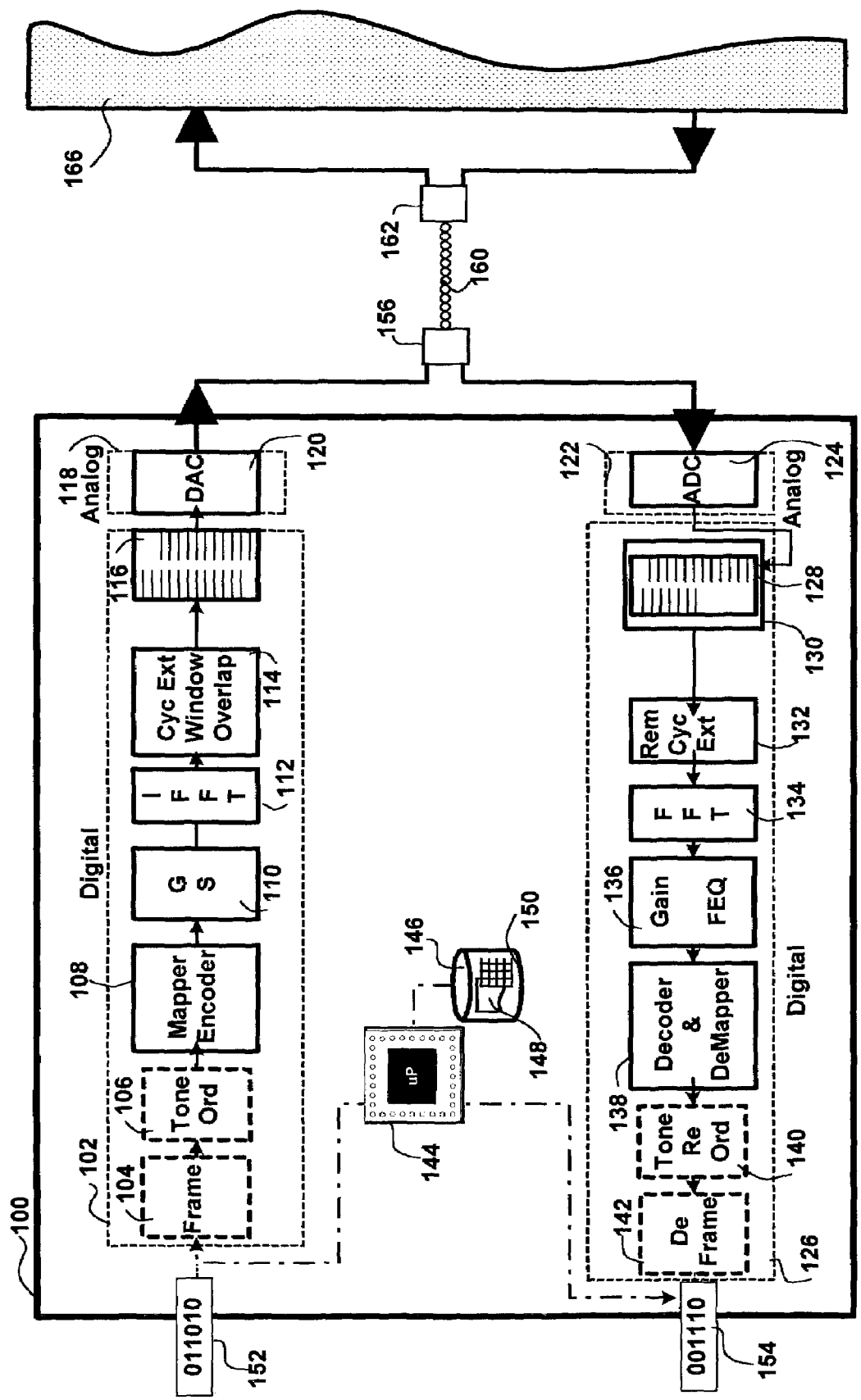
FIG. 1 is a hardware block diagram showing an embodiment of a transceiver in which to practice the current invention including high throughput decoding of a convolutionally encoded data stream.

FIG. 1 is a hardware block diagram showing an embodiment of a transceiver in which to practice the current invention including high throughput decoding of a convolutionally encoded data stream. The transceiver 100 is shown coupled via a subscriber line 160 with an opposing transceiver 166. Each transceiver 100, 166 includes an associated hybrid front end (HFE) 156, 162 respectively for coupling to the subscriber line. The transceiver includes a transmit path and a receive path. The transmit path includes digital and analog portions 102 and 118 respectively for modulation of data. In the embodiment shown the transmit and receive paths include components suitable for multi-tone modulation protocols such as those used in digital subscriber lines.

During showtime the transmit path accepts a digital stream 152 as input and passes that stream through successive modulation stages. In the framer 104 the data is parsed into predefined packets of bits, with the number of bits determined by the bandwidth of the communication medium established during transceiver initialization. In the tone orderer 106 the bits are allocated across the tone bins associated with each of the digital multi-tone (DMT) sub-channels. The specific number of bits per tone is established during the initialization of the transceiver. Next in the mapper and encoder 108 the bits for each tone are converted to a complex number or sub-symbol/symbol which defines the phase and amplitude relationship with which to modulate each sub-channel's carrier tone and each sub-symbol is convolution encoded. Next, gain scaling is performed in the gain scaler 110. Then all of the sub-symbols a.k.a. tones are converted from the frequency to the time domain. This is accomplished in the inverse Fourier transform (IFFT) engine 112. Next in module 114 the cyclic extension, windowing and window overlap is applied to the digitized symbol output of the IFFT. The delay advance buffer 116 couples module 114 with the Digital to Analog converter (DAC) 120 which is part of the analog portion 118 of the transmit path. The analog portion may also include an interpolator and digital or analog filters, in alternate embodiments of the invention.

The receive path includes analog and digital portions 122 and 126 respectively for demodulation of data. During showtime the receive path accepts modulated data from subscriber line 160 and digitizes the received data in the analog-to-digital converter (ADC) 124 which is part of the analog portion 122 of the receive path. The analog portion may also include digital or analog filters and a decimator, in alternate embodiments of the invention. The digitized data is passed to the window synchronizer 130. The window synchronizer obtains windowed portions of the received datastream from its buffer 128 and passes each widowed portion to the cyclic prefix removal module 132. The windowed portions passed from the buffer by the window synchronizer are synchronized with symbol boundaries in the incoming datastream. The symbol may include within its boundaries at this phase of receive path processing both a cyclic prefix and suffix which are removed in the cyclic prefix removal module/component.

Next in the fast Fourier transform (FFT) engine 134 each tone in the time domain is converted to a corresponding tone a.k.a. sub-symbol in the frequency domain. Each sub-symbol may be represented mathematically as a complex number expressing the phase and amplitude relationship between the carrier tone and the pilot or message data modulated thereon. Collectively each set of sub-symbols/tones make up a symbol. Next the appropriate gain scaling and frequency equalization is performed in the gain FEQ module 136. Subsequently, each sub-symbol is decoded and demapped to a corresponding binary sequence in the decoder 138. The resultant bits associated with each tone are then re-ordered into the initially transmitted sequence via the tone re-orderer 140 and de-framed in de-framer 142. The resultant demodulated digital data stream 154 is output from the de-framer.

The core processor 144 is shown coupled to the transmit and receive path components as well as to the memory 146. The memory stores setup data 148 for the specific DMT protocols which the transceiver supports as well as initialization data 150, e.g. gain tables, equalization parameters, PSD parameters etc. determined during the initialization of a pair of transceivers across a given wired or wireless communication medium.

Figure 2:
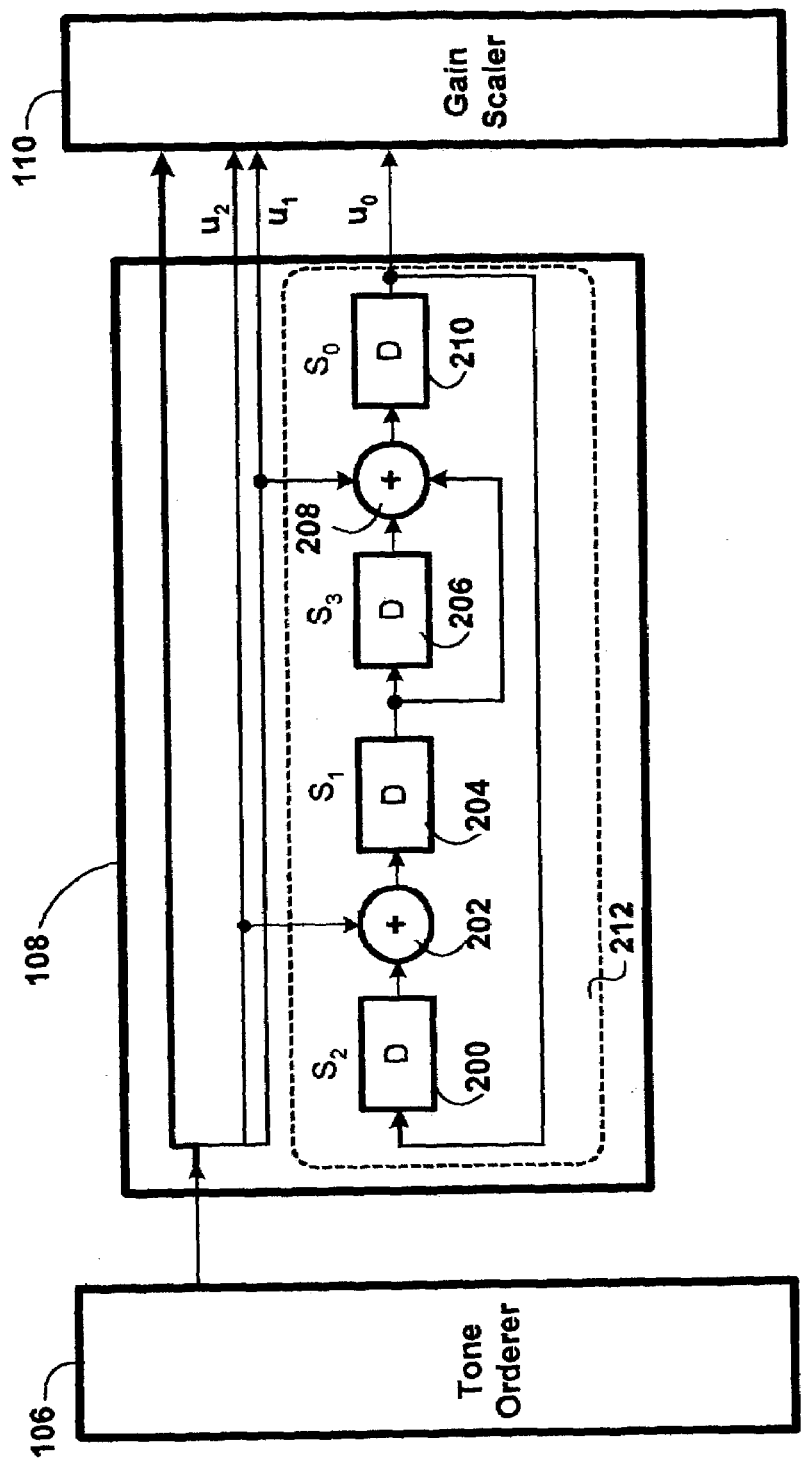
FIG. 2 is a detailed hardware block diagram of an embodiment of an convolution encoder shown in FIG. 1 for use with a multi-tone modulation protocol with a 64 point constellation.

FIG. 2 is a detailed hardware block diagram of an embodiment of an convolution encoder portion 212 of the mapper encoder 108 shown in FIG. 1 for use with a multi-tone modulation protocol with a 64 point constellation. The particular encoder is that specified by the International Telecommunications Union (ITU) for use in digital subscriber lines implementing an ADSL modulation protocol, ITU-T Recommendation G.992.1 Asymmetric Digital Subscriber Line (ADSL) Transceivers, June 1999, at Page 44 (G.992.1) which is hereby incorporated by reference as if fully set forth herein. Selected bits from the odd and even tones are encoded in an "m"=4 maximul memory order encoder 212. The encoder is implemented with 4 "D" flip-flops 200, 204, 206, 210 and two adders 202 and 208. The encoded mapped output of the encoder mapper is passed to the gain scaler 110.

Figure 3:
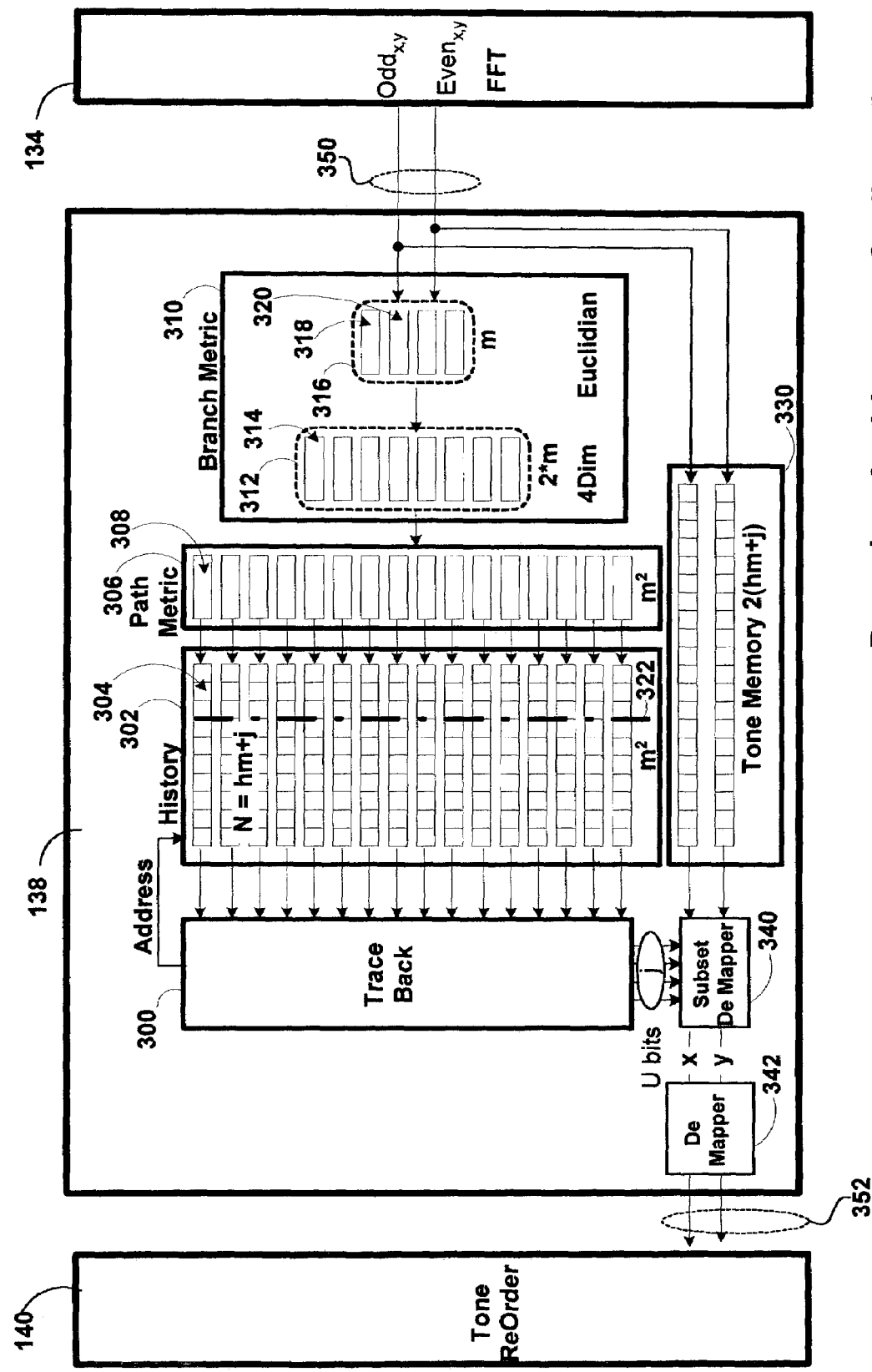
FIG. 3 is a hardware block diagram of an embodiment of the demapper and convolutional decoder shown in FIG. 1.

FIG. 3 is a hardware block diagram of an embodiment of the demapper and convolutional decoder 138 shown in FIG. 1. In this embodiment of the invention the decoder implements the Viterbi Algorithm. The particular architecture and components in this embodiment are for a multi-tone protocol such as ADSL with a 64 point constellation. The decoder includes a branch metric component 310, a path metric component 308, history buffers 302 and a traceback component 300 pipeline coupled to one another. The decoder also includes a tone memory 330, a subset demapper 340 and a demapper 342. Architecturally, each stage of the pipeline formed by the branch and path metrics and the history buffers exploits high degrees of parallelism to increase throughput. The branch metric component includes: Euclidian distance and four dimensional distance components 316 and 312 respectively. In the embodiment shown the Euclidian distance component includes subcomponents equal in number in a multi-tone modulation protocol to m where m is the maximul memory order of the encoder which in the example shown in FIG. 2 is m equals 4. In the embodiment shown the four dimensional (4-D) distance component includes subcomponents equal in number to 2*m. Thus, 8 subcomponents are shown of which subcomponent 314 is referenced. In the embodiment shown the path metric component includes subcomponents equal in number to $m^2$. Thus, 16 subcomponents are shown of which subcomponent 308 is referenced. In the embodiment shown the history buffers includes first-in-first-out (FIFO) buffers equal in number to $m^2$. Thus, 16 history buffers are shown of which buffer 304 is referenced. The depth or length of the history buffers is N=hm+j where h is the recommended maximul memory order scale factor for the buffers, e.g. 6, as provided in associated standards and literature, m is the maximul memory order of the encoder in this case 4, and j is the number of sub-symbols/symbols that will be decoded in a single traceback by the novel traceback component 300. Generally j will chosen as an integer fraction of the buffer depth N as set by the corresponding standard or recommended in the literature.

The traceback component 300 avoids bottlenecking the branch and path metric components by virtue of a novel traceback architecture a portion of which is exhibited in the extended length of the history buffers, in this case represented by those buffers lying to the right of vertical line 322. By performing overlapping tracebacks during each traceback cycle the traceback unit is able to output j sub-symbol correction factors in each traceback cycle instead of the single sub-symbol correction factor which prior art methods provide for each traceback cycle (See FIGS. 7–8). Since j is a fraction of the standard history buffer depth the additional time required to provide the additional j–1 correction factors for the decoding of j sub-symbols/symbols is minimal in comparison to the time required to perform each traceback for each correction factor serially as is the case in the prior art. The j sub-symbol/symbol correction factors outputs of the traceback component are delivered to the subset demapper 340 where they are combined with the original corresponding sub-symbols from the tone memory 330 and the resultant error corrected sub-symbols are passed to the demapper 342. In the demapper each sub-symbol is demapped to the corresponding bits 352 and provided to the tone reorderer 140.

The embodiment of the invention shown above exploits high degrees of parallelism along with pipelining. In alternate embodiments of the invention reduced degrees of parallelism can be implemented with concurrent increases in clock speeds in any one or all of the branch metric, the path metric or the history buffers. In still another embodiment of the invention in which the modulation protocols do not include multiple tones, the input to the decoder will be successive received symbols as specified by the relevant modulation protocol rather than the sub-symbols of a multi-tone protocol such as DMT. Thus the decoder set forth in this and the following drawings and in particular the overlapping traceback performed by the traceback component can be implemented in decoders of a wide variety of designs in communication systems implementing modulation protocols such as: digital multi-tone (DMT), carrierless AM/PM (CAP), quadrature amplitude modulation (QAM), quadrature phase amplitude modulation (QPAM), code division multiple access (CDMA), binary shift keying (BPSK), quaternary phase shift keying (QPSK), etc. Consistent with the broad range of protocols to which the decoder of the current invention is applicable the term sub-symbol or symbol will be used interchangeably and will be understood to reference the units in which bits are modulated and the associated method for modulation in the corresponding communication protocol.

The traceback component 300 may be used in combination with any upstream convolutional decoder architecture used to implement Viterbi or other convolutional decoding algorithms. To perform trace back history of all states must be stored for a depth N. The larger the N the smaller the truncation error. The probability of truncation error decreases exponentially with decoding depth N. At low signal to noise ratios, the probability of truncation error is negligible for N>5.8m, where m is the maximal memory order (the length of the longest shift register in the encoder). The value of m for the encoder shown in FIG. 2 in this embodiment of the invention is 4.

FIGS. 4A–D are detailed hardware block diagrams of an embodiment of the branch metric, path metric, and demapper components of the decoder shown in FIG. 3.

FIG. 4A shows an embodiment of the subcomponents 318 and 320 which are part of the Euclidian distance component. The circuits shown in this Figure may be implemented in hardware or software for computing two dimensional Euclidean distances. The four subcomponents of the Euclidian distance portion of the branch metric generate four combinations described in the above referenced G.992.1 standard for each vector v and w. The subcomponent 318 includes adder/subtractor 402, twos complement unit 404, a mux 406, a square unit 408. The subcomponent 320 includes adder/subtractor 410, twos complement unit 404, a mux 406, a square 408. The adders of each subcomponent accept as input the selected bits of the x and y components of each sub-symbol. In the example shown the adders 402, 410 accept as input the x and y components of the odd tones with the other two subcomponents accepting the x and y components of the even tones. The select inputs for the adders 402, 410 are picked based on the values of $v_0$, $v_1$ and $w_0$, $w_1$. The $v_0/w_0$ inputs control the adder for x coordinate for even/odd tones and $v_1/w_1$ control the adder for Y coordinate for even/odd tones. A zero select is an add operation and 1 is a subtract operation. After the adders 402, 410 there are corresponding multiplexers 406, 414 respectively which based on the sign bit of the corresponding input from the adder selects one of the outputs shown. If the output of the adder is all zero then all 1 is output. If positive the two's complement is output else if negative the value is not altered. The output of the mux 406 is squared in unit 408. The output of the mux 414 is squared in unit 416. The outputs of each pair of subcomponent blocks, e.g. pair 318–320 are added in adder 418 the output of which is passed to the 4-D component 312 shown in FIG. 3. There is another pair of subcomponents identical to 318–320 for handling the Euclidian distance computation.

Figure 6:
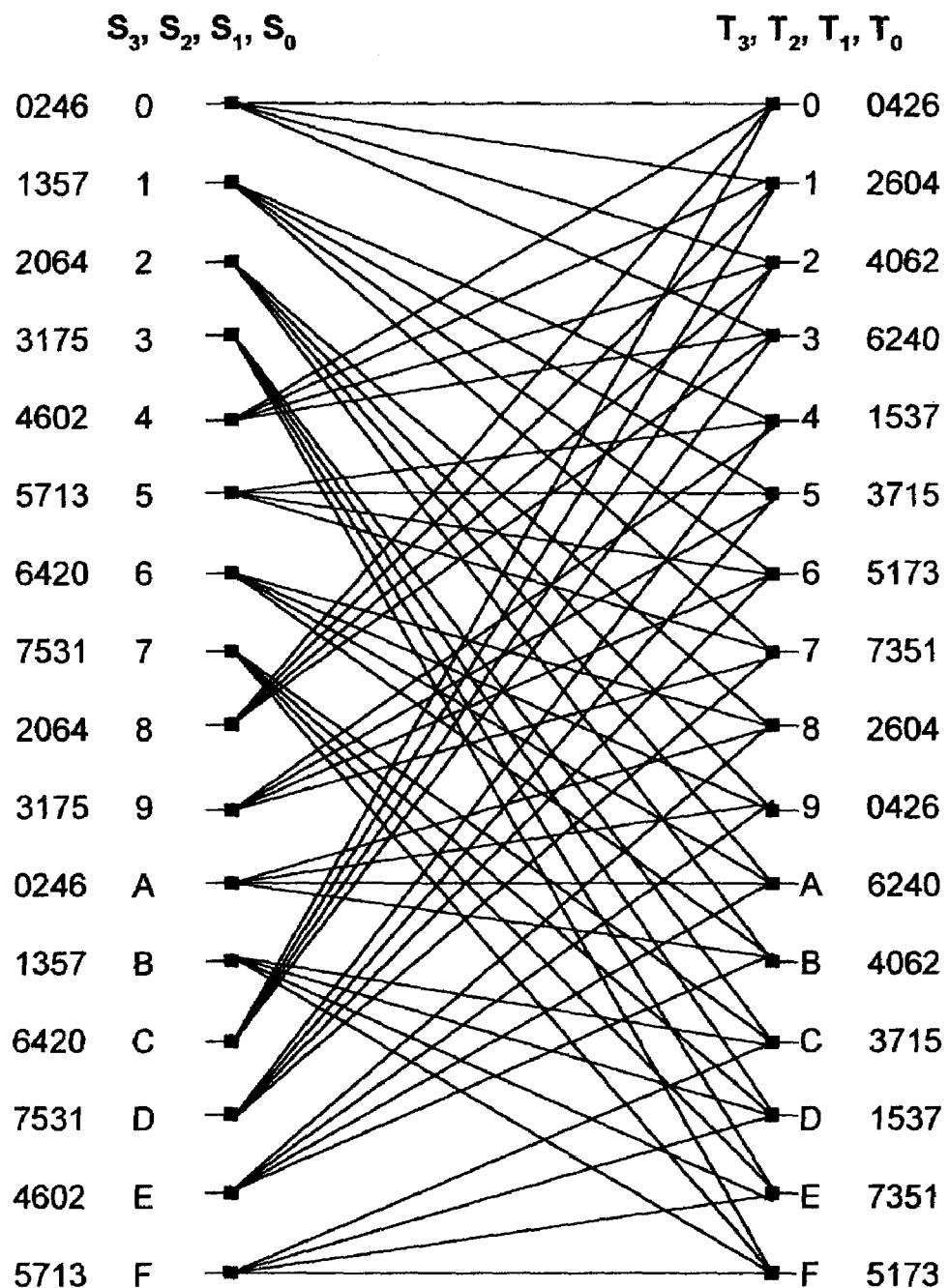
FIG. 6 is a Trellis diagram showing an embodiment of the architectural layout between the branch and path metric portions of the convolutional decoder shown in FIG. 2.

FIG. 4B shows subcomponent 314 which is one of the eight subcomponents utilized in the embodiment shown to compute the four dimensional distance (4-D) in the 4-D component 312 of the branch metric component 310 shown in FIG. 3. The circuitry includes multilexers 424–426, providing inputs to adder 422, which in turn provides input to multiplexer 420 and comparator 428. The circuitry computes distance in a manner consistent with the G.992.1 standard, and specifically the Table 7.11 of that standard a copy of which is shown in FIG. 5, to compute the four dimensional distances. Based on the table muxes 424–426 picks a combination of two Euclidian, a.k.a. 2-dimensional distances, v and w, for each four dimensional distance. The outputs of the muxes are added by adder 422 to produce sum A. Similar circuitry (not shown) is utilized to obtain sum B with inputs ordered as provided by the corresponding standard. Mux 420 selects one sum A or B based on the output of the comparator 428 thus selecting the smaller distance represented by sum A, sum B. The outputs of the multiplexer and comparator of each of the 8 subcomponents of the 4-D component are provided as inputs to corresponding ones of the 16 subcomponents of the path metric component 306 (See FIG. 3) in accordance with the trellis map shown in the G.992.1 standard, a copy of which is shown in FIG. 6.

Figure 4C:
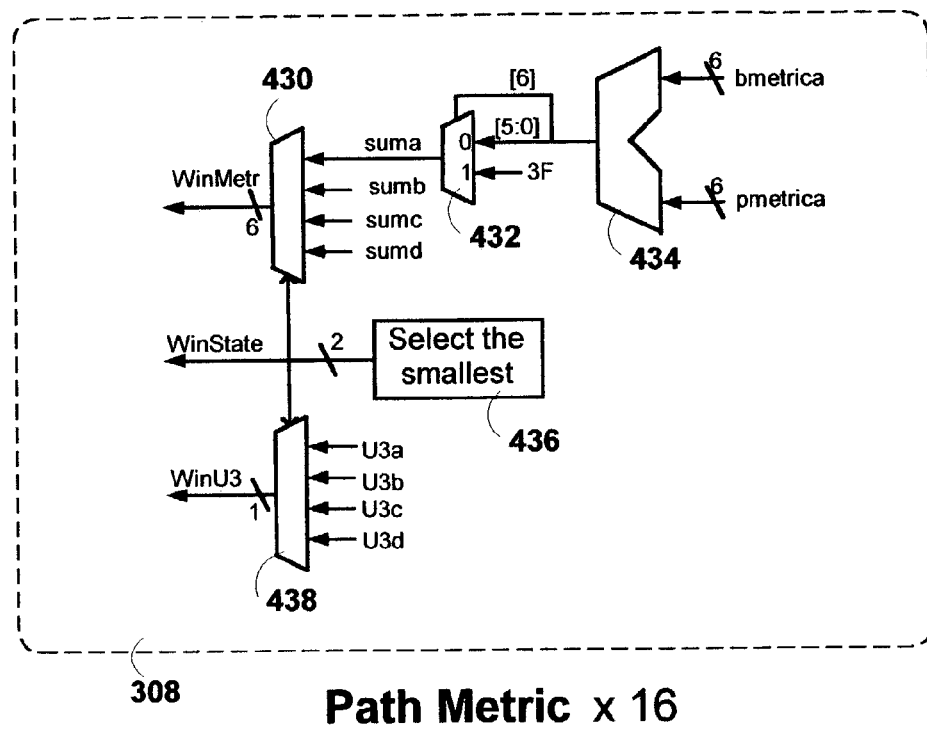

FIG. 4C shows an embodiment of a representative one, e.g. subcomponent 308, of the 16 add compare select (ACS) subcomponents of the path metric component 306 shown in FIG. 3. An adder 434 accepts inputs from a corresponding branch metric and a feedback of an output from one of the path metric subcomponents. The particular mapping of these connections is specified by the relevant standard in this case the G.992.1 standard and set forth in the trellis map shown in the following FIG. 6 which conforms with that standard. Multiplexers 432, 430 and 438 are shown. Multiplexer 432 accepts input from the adder 434 and in the event of an overflow it fixes the value a 3F (Hex). The output of Mux 432, sum A, is one of four inputs to mux 430, the others of which are sums B, C, D which are provided by similar circuitry not shown each of which accepts different branch and path metric inputs. A selector 436 is used to select the winning state. Each of multiplexers 430, 438 outputs the winning metric and the winning U3 respectively. The Path metric component calculates a new path metric distance by selecting the wining branch metric and adding it to the previous value of the path metric. It employs 16 ACS units to calculate wining metric for the 16 states of the trellis diagram. FIG. 4C shows the data path for one ACS unit. Every ACS unit uses one branch metric and one path metric as input corresponding adder, e.g. adder 434. Output is the wining metric value, state, and U3. Over time the output of the ACS units will overflow. When all 16 state's most significant bit are one a rescale operation is performed. Rescaling is done by zeroing the most significant bits of all path metrics.

Figure 4D:
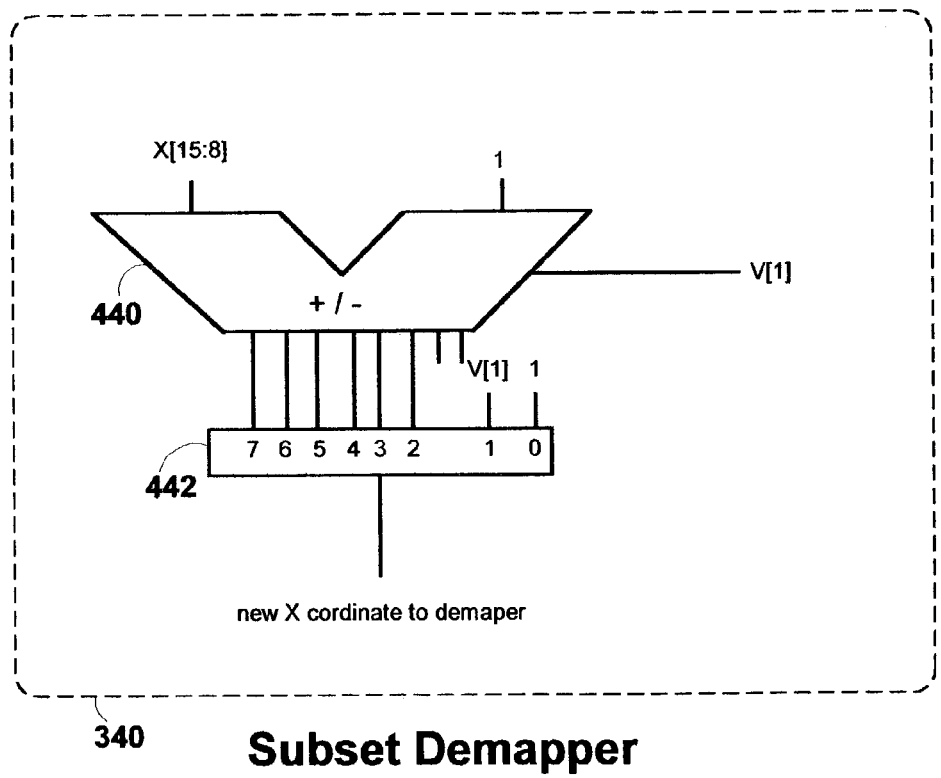

FIG. 4D shows an embodiment of the subset demapper 340 shown in FIG. 3. An adder-subtractor 440 and a register 442 are shown. Each of the successive j correction factors from the traceback component are serially provided to the control input V[1] of the adder subtractor 440. The value of each correction factor determines whether the operation performed will be an add or a subtract. The inputs of the adder 440 are "1" and the x component of the corresponding odd or even tone. All except the two least significant bits of the adder output are stored in register 442 which also accepts as inputs the value 1 for the least significant bit and the value j of the corresponding factor as the next least significant bit. The register contents are output on each clock cycle.

Trace back operation generates the new values for each of the j conversion factors, e.g.: U0, U1, U2, and U3. The new U values are used to select the subset for each tones and modify the x and y coordinate values accordingly. The following equations are used to generate the list significant bits of V and W.

$$V[1]=U[1]\char`\^U[3]$$

$$V[0]=U[3]$$

$$W[1]=U[0]\char`\^U[1]\char`\^U[2]\char`\^U[3]$$

$$W[0]=U[2]\char`\^U[3]$$

The tone values are modified based on the 2-dimensional Coset selected by V[1:0] and W[1:0]. FIG. 4D shows the data path for X coordinate calculation. A similar data path is used for y coordinate calculations except V[0] is used as the mux select.

FIG. 5 is a table showing an embodiment of the Euclidian to four dimensional architectural layout for the branch metric portion of the convolutional decoder shown in FIG. 3 for a modulation protocol with a 64 point constellation as specified in the G.992.1 standard discussed above.

FIG. 6 is a Trellis diagram showing an embodiment of the architectural layout between the branch and path metric portions of the convolutional decoder shown in FIG. 2 as specified in the G.992.1 standard discussed above.

Figure 7:
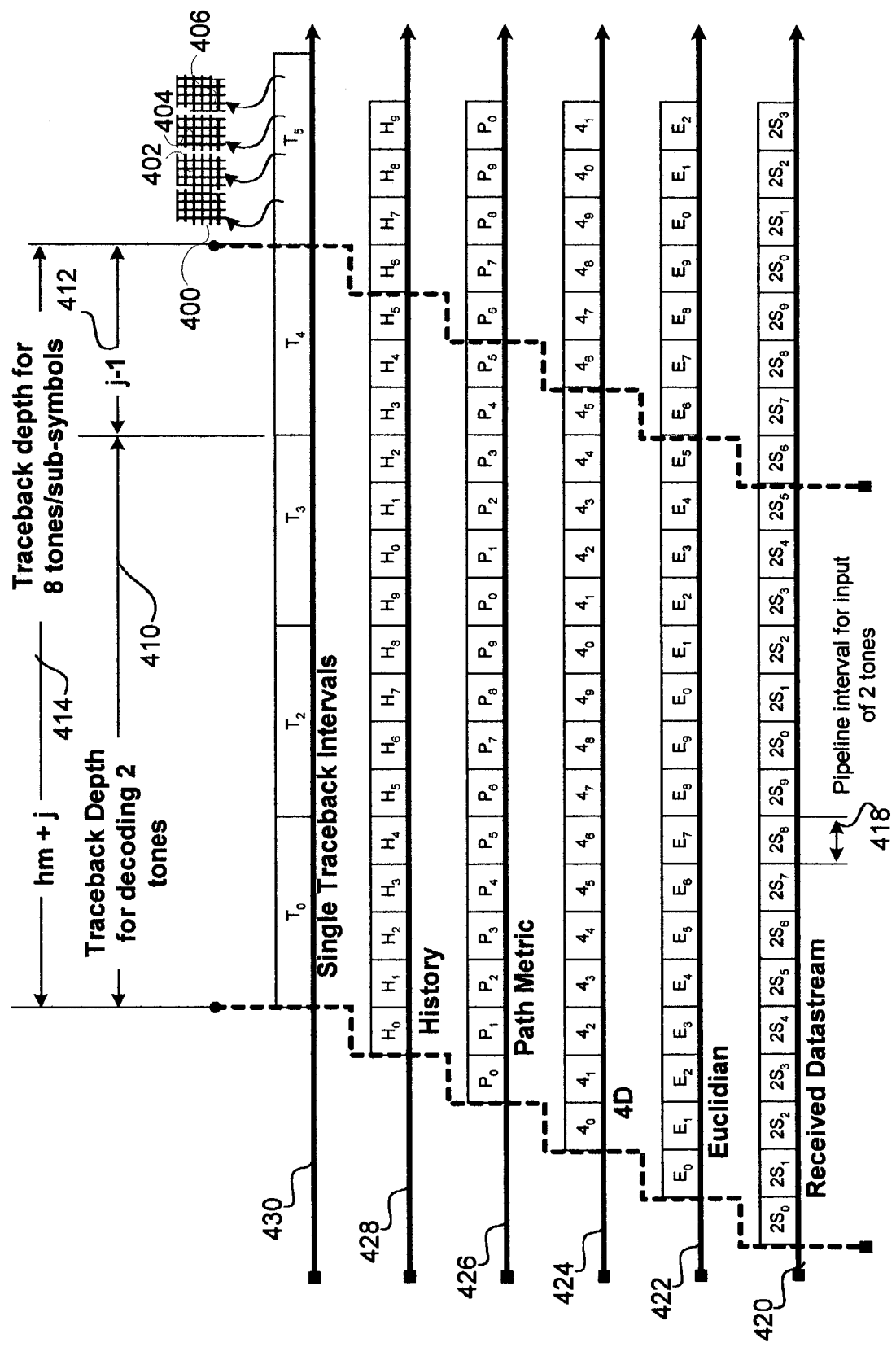
FIG. 7 is a timing diagram showing pipeline timing between various stages of the decoder shown in FIG. 2 including the timing required for the traceback component to generate "j" correction factors for decoding "j" corresponding symbols or sub-symbols in each traceback.

FIG. 7 is a timing diagram showing pipeline timing of various stages of the decoder shown in FIG. 2 including the timing required for the traceback component to generate j correction factors for decoding j corresponding sub-symbols/symbols in each traceback. Relative pipeline processing cycles to accept an input and generate an output are shown for each of the Euclidian, 4-D, path metric, history buffers and traceback components. The input datastream timeline 420 is shown with each pipeline cycle corresponding to the interval 418 over which a pair of tones, e.g. odd and even, are received from the incoming datastream.

The first stage of the pipeline is formed by the Euclidian distance component 316 (See FIG. 3) the quantity m subcomponents of which generate m 2-D branch metrics for a pair of odd and even tones, a.k.a. sub-symbols, from the encoded input datastream in each of the pipeline cycles, e.g. $E_0 \ldots E_9$, shown on the Euclidian pipeline cycle timeline 422.

The second stage of the pipeline is formed by the four dimensional distance component 312 (See FIG. 3) the quantity 2m sub-components of which generate 2m four dimensional branch metrics from the two dimensional branch metrics supplied by two dimensional component in each pipeline cycle. The pipeline cycles, e.g. $4_0 \ldots 4_9$, shown on the four dimensional pipeline cycle timeline 424 have the same relative duration as the Euclidian pipeline cycle timeline.

The third stage of the pipeline is formed by the path metric component 306 (See FIG. 3) the quantity $m^2$ sub-components of which generate $m^2$ path metrics from the four dimensional branch metrics supplied by the four dimensional component in each pipeline cycle. The pipeline cycles, e.g. $P_0 \ldots P_9$, shown on the path metric pipeline cycle timeline 426 have the same relative duration as the Euclidian and four dimensional pipeline cycle timelines.

The fourth stage of the pipeline is formed by the history buffers 302 (See FIG. 3) the quantity $m^2$ buffers of which store on a first in first out (FIFO) basis the $m^2$ path metrics from the path metric component. The history buffer depth or length spans N=(hm+j) pipeline cycles of the path metric component. In this instance N=32 arrived at as follows. The recommended maximul memory order scale factor h equals 6 and m the maximul memory order of the encoder equals 4. The number of sub-symbols/symbols that will be decoded in a single traceback j equals 8. The pipeline cycles for each new set of path metrics to be added to the history buffers, e.g. $H_0 \ldots H_9$, is shown on the history buffer pipeline cycle timeline 428.

The history buffer depths of the current invention are extended by an amount j−1 as compared to prior art units. This fractional extension corresponding in the example discussed to (j−1)/(hm)=7/32 or 21% allows the traceback component to decode j sub-symbols/symbols in a single traceback as opposed to a single sub-symbol/symbol. In an embodiment of the invention In an embodiment of the invention the history buffers may be increased in length by an additional amount to avoid over-writing the old values before the trace back is complete. In the above discussed example, the history buffer depth may be increased from 32 to 40 and implemented as circular buffer. The trace back state machine starts a new trace back operation immediately after finishing the last one and increments the start pointer by 8. At the end of code block the trace back state machine will do one last trace back and releases all the remaining tones.

The fifth stage of the pipeline is formed by the traceback component 300 (See FIG. 3). The traceback component generates in each traceback interval a single extended traceback which determines the j correction factors for decoding j sub-symbols/symbols. In the embodiment shown j equals 8. The traceback depth 410 for decoding one tone per traceback spans 12 pipeline cycles during each of which a pair of tones is processed. The traceback depth 414 for decoding j tones per traceback spans 16 pipeline cycles during each of which a pair of tones is processed. The traceback extension 412 corresponds to the difference between the traceback lengths for the single and multi-tone case. The extension interval 412 also corresponds to the time to generate a single traceback. In the example shown the single traceback is performed in 4 pipeline cycles during which 8 tones, i.e. 4 pairs 400–406 with 2 tones per pair are decoded. At the end of each traceback interval, e.g. $T_0$, $T_1$, $T_2$, $T \ldots T_n$ the history buffers flush 8 tones.

The length of the traceback corresponds with the time required to decode each of the j−1 additional sub-symbols/symbols in each traceback. This corresponds with 1/(hm) where hm is the recommended buffer or traceback length for decoding one sub-symbol/symbol. In the example shown the extended traceback cycle spans (hm+j)=32 input sub-symbol/symbol intervals and decodes correction factors for j=8 sub-symbols/symbols. A prior art traceback unit employing prior art techniques on a pair of input tones would perform 4 successive tracebacks each spanning (hm)=24 sub-symbol/symbol instances for a collective total of 4×24=96 sub-symbol/symbol instances. Thus, assuming traceback times from one to the next symbol instance are equal the traceback component of the current invention requires 32/96=0.33 only 33% of the processing bandwidth of prior art traceback components. Thus extending the traceback length and decoding the correction factors for a succession of sub-symbols/symbols in a single traceback provides a significant improvement in the traceback components throughput.

In alternate embodiments of the invention the number of sub-symbols/symbols for which correction factors are decoded in each single traceback will vary depending on the modulation protocol.

Figure 8:
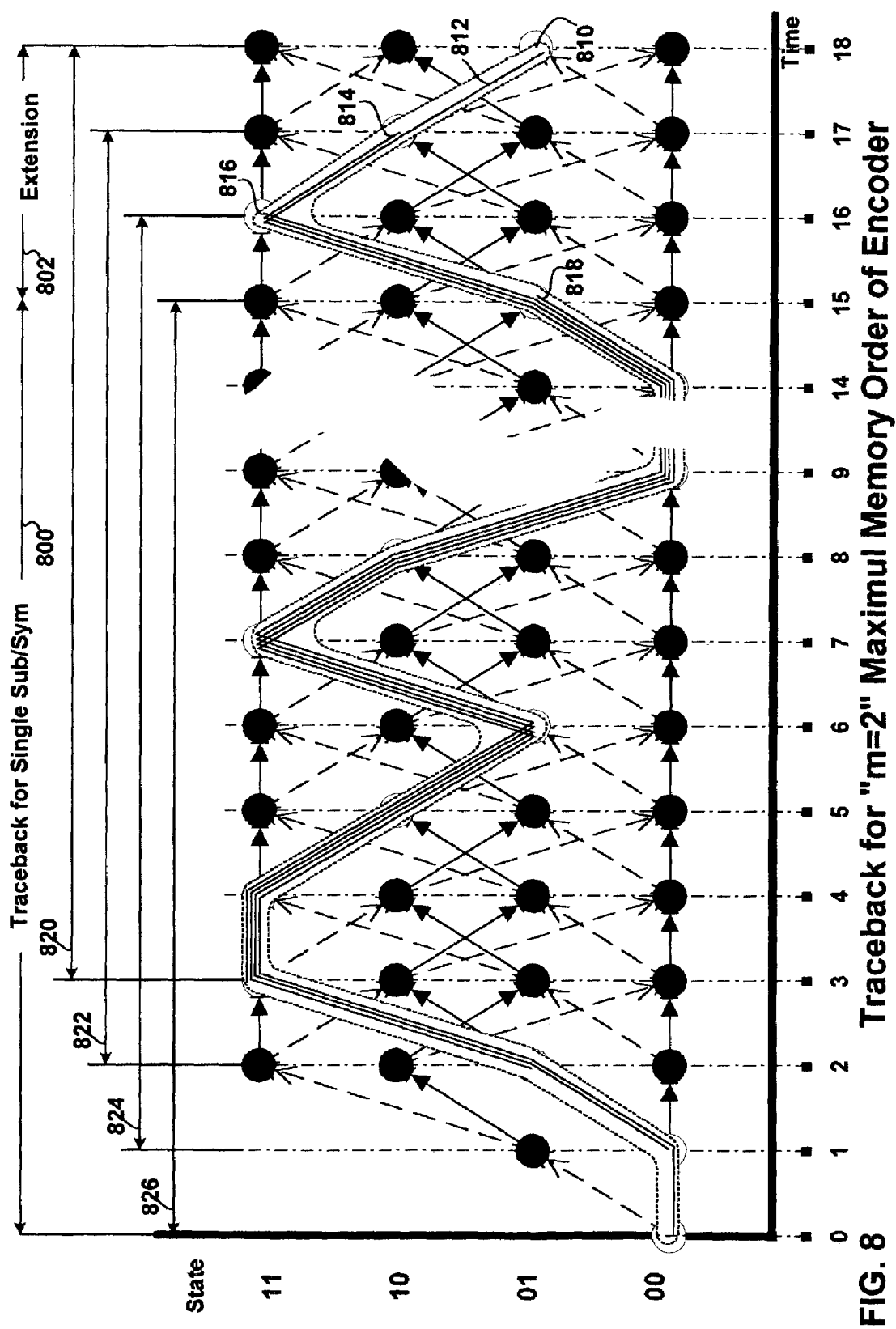
FIG. 8 is a Trellis diagram for an m=2 state encoded datastream in which the traceback component decodes multiple successive symbols or sub-symbols in each traceback interval from a single extended traceback.

FIG. 8 is a Trellis diagram for an m=2 state encoded datastream with j=4. The diagram shows the method by which traceback component decodes multiple successive symbols or sub-symbols in each traceback interval from a single extended traceback. The traceback length 800 for decoding a single sub-symbol/symbol's correction factor is shown spanning 16 successive sub-symbol/symbols of the received datastream. The addition to the single traceback length of the extended trace interval 802 allows a single traceback path 810 to be used for decoding j−1 additional sub-symbol or symbol correction factors. The penalty in terms of processing time or complexity is slight since all decoding is done from a single traceback path 810. The portion 812 of the single traceback path associated with decoding the sub-symbol/symbol received at time t=18 spans the sub-symbol/symbol interval 820 from t=3 to t=18. The portion 814 of the single traceback path associated with decoding the sub-symbol/symbol received at time t=17 spans the sub-symbol/symbol interval 822 from t=2 to t=17. The portion 816 of the single traceback path associated with decoding the sub-symbol/symbol received at time t=16 spans the sub-symbol/symbol input interval 824 from t=1 to t=16. The portion 818 of the single traceback path associated with decoding the sub-symbol/symbol received at time t=15 spans the sub-symbol/symbol input interval 826 from t=0 to t=15. Each of the individual symbols traceback paths 812–818 overlap one another and thus only a single extended traceback path 810 is needed to decode the successive sub-symbols/symbols received over the time interval from t=15 to t=18. An additional benefit of the extended traceback pathlength 810 is that the accuracy of decoding the least recently received symbols is enhanced by virtue of the extensions to the traceback length required to decode the more recently received ones of the j sub-symbol/symbols in each set.

Figure 9:
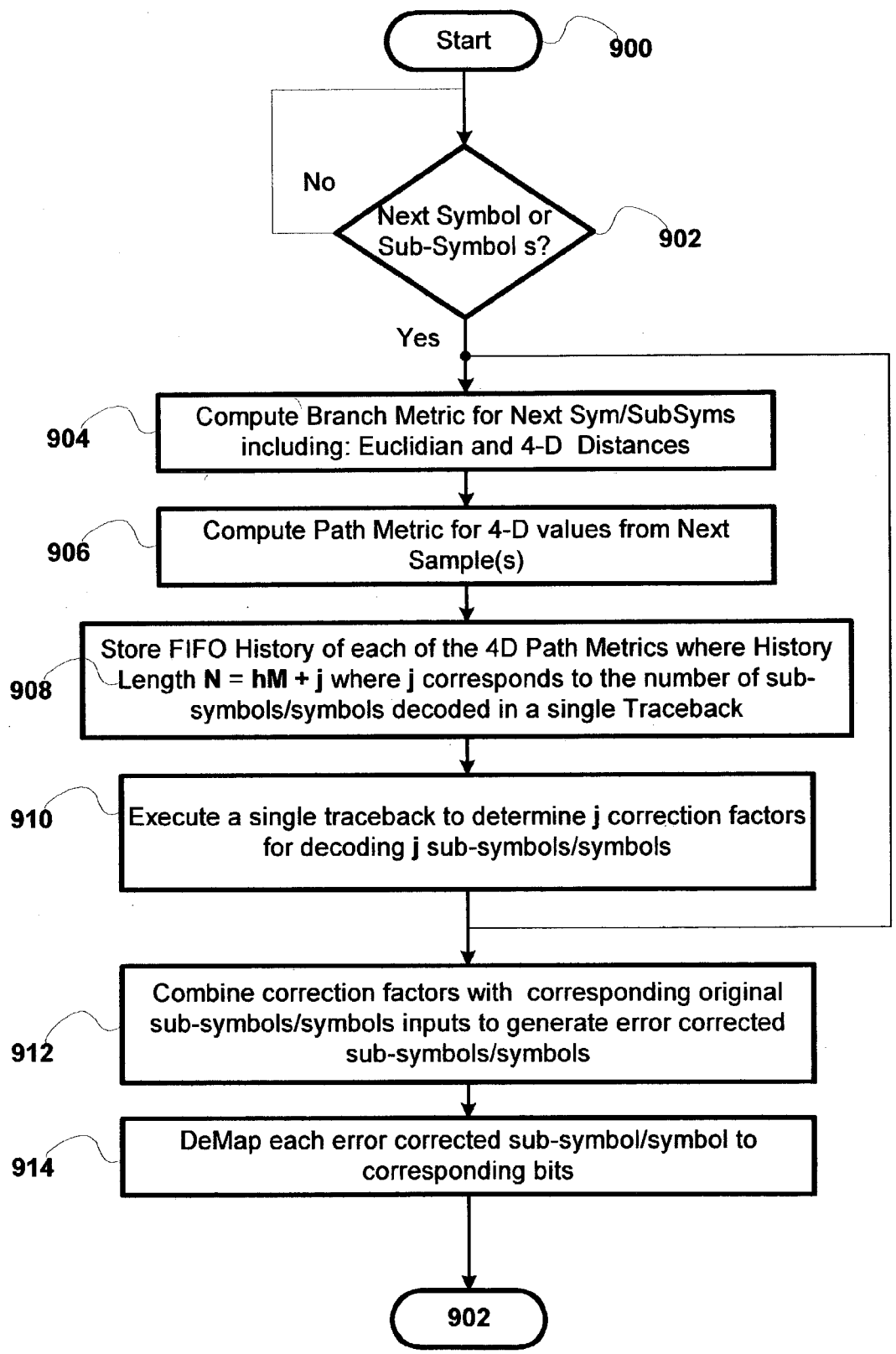
FIG. 9 is a process flow diagram showing the processes performed in an decoder in accordance with an embodiment of the current invention.

FIG. 9 is a process flow diagram showing the processes performed in a decoder in accordance with an embodiment of the current invention. After initialization in start process 900 control is passed to decision process 902 for a determination of the availability of the next symbol or sub-symbols to be subject to convolutional decoding. When the next symbol or sub-symbol is received it is passed to process 904. In process 904 the branch metric for the symbol or sub-symbols is computed. The processing of a single symbol or multiple sub-symbols concurrently will be determined by the modulation protocol, e.g. single or multiple carrier and the architecture of the system. After computing Euclidian and 4-D distances control is passed to process 906 in which the path metric is computed from the 4-D values computed in the branch metric along with whatever path metric feedback is required. Next in process 908 the path metrics are stored in FIFO history buffers where the history buffer length is hm+j with j corresponding to the number of concurrent overlapping tracebacks executed in the traceback unit, h is the recommended maximul memory order scale factor for the buffers, e.g. 6, as provided in associated standards and literature and m is the maximul memory order of the encoder, which in the embodiment shown in FIG. 2 is 4. Next control is passed to process 910 in which concurrent overlapping tracebacks are performed to generate j correction factors for j corresponding sub-symbols or symbols of the received data stream. Next in process 912 each of the j correction factors is combined with corresponding ones of the original symbol or sub-symbol inputs to generate corrected symbols or sub-symbols. Finally in process 914 each corrected symbol or sub-symbol is demapped to the corresponding bits and passed to any additional receive path processing such as de-framing. For the decoder control returns to process 902.

The foregoing description of a preferred embodiment of the invention has been presented for purposes of illustration and description. It is not intended to be exhaustive or to limit the invention to the precise forms disclosed. Obviously many modifications and variations will be apparent to practitioners skilled in this art. It is intended that the scope of the invention be defined by the following claims and their equivalents.

What is claimed is:

1. An apparatus for error correction of a convolutionally encoded datastream received from a communication medium and the apparatus comprising:
   a branch metric component to determine branch metrics for the encoded datastream;
   a path metric component coupled to the branch metric to determine path metrics from the branch metrics determined by the branch metric component; and
   a traceback component coupled to the path metric component to trace in each traceback interval a single path through the path metrics to determine correction factors for decoding at least two corresponding successive sub-symbols/symbols from the encoded datastream in each traceback interval.

2. The apparatus of claim 1, wherein the single path exhibits a length expressed as:

$N=hm+j$ where m is a maximul memory order associated with encoding of the encoded datastream, h is a maximul memory order scale factor, and j is a number of sub-symbols/symbols that will be decoded from the single path.

3. The apparatus of claim 2, wherein further j is an integer fraction of N.

4. The apparatus of claim 1, further comprising:
   a plurality of history buffers coupling the path metric component to the traceback component to buffer successive sets of path metrics from the path metric component for traceback by the traceback component.

5. The apparatus of claim 1, further comprising:
   a subset demapper coupled to the traceback component for combining the correction factors from the traceback component with the at least two corresponding successive sub-symbols/symbols from the encoded datastream to generate resultant error corrected sub-symbols/symbols corresponding thereto; and
   a demapper coupled to the subset demapper to demap each error corrected sub-symbol/symbol to the corresponding bits.

6. The apparatus of claim 1, wherein the communication medium comprises one of a wired medium and a wireless medium.

7. The apparatus of claim 1, wherein the encoded datastream exhibits at least one of: a discrete multi-tone (DMT) communication protocol, a carrierless AM/PM (CAP) communication protocol, a quadrature amplitude modulation (QAM) communication protocol, a quadrature phase amplitude modulation (QPAM) communication protocol, a code division multiple access (CDMA) communication protocol, a binary shift keying (BPSK) communication protocol, a quaternary phase shift keying (QPSK) communication protocol.

8. A pipelined Viterbi decoder for decoding a multi-tone modulated datastream encoded with convolutional encoder with a maximul memory order "m", and the pipelined Viterbi decoder comprising:
   a two-dimensional branch metric component accepting in each of successive pipeline processing intervals an input of a pair of tones and determining there from a quantity m two-dimensional branch metrics;
   a four-dimensional branch metric component coupled to the two-dimensional branch metric component to determine in each successive pipeline processing interval a quantity 2m four-dimensional branch metrics from the m two-dimensional branch metrics;
   a path metric component coupled to the four-dimensional branch metric component to determine in each successive pipeline processing interval a quantity $m^2$ path metrics from the 2m four-dimensional branch metrics; and
   a traceback component coupled to the path metric component to repetitively traceback through a succession of the path metrics provided by the path metric to determine in each traceback interval correction factors for decoding at least two corresponding ones of the tones.

9. The pipelined Viterbi decoder of claim 8, wherein each of the two-dimensional, four-dimensional and path metric components include corresponding sub-components determining in parallel the corresponding metric and numbering in a quantity m, 2m and $m^2$ respectively.

10. The pipelined Viterbi decoder of claim 8 wherein the traceback component further traces in each repetitive traceback, a single path through the path metrics to determine correction factors for decoding at least two corresponding tones from the input datastream.

11. The pipelined Viterbi decoder of claim 10, wherein the single path exhibits a length expressed as:

$N=hm+j$ where m is a maximul memory order associated with encoding of the encoded datastream, h is a maximul memory order scale factor, and j is a number of tones that will be decoded from the single path.

12. The pipelined Viterbi decoder of claim 11, wherein further j is an integer fraction of N.

13. The pipelined Viterbi decoder of claim 8, further comprising:
    a plurality of history buffers coupling the path metric component to the traceback component to buffer successive sets of path metrics from the path metric component for traceback by the traceback component.

14. The pipelined Viterbi decoder of claim 8, further comprising:
    a subset demapper coupled to the traceback component for combining the correction factors from the traceback component with the at least two corresponding tones from the encoded datastream to generate resultant error corrected tones corresponding thereto; and
    a demapper coupled to the subset demapper to demap each error corrected tone to the corresponding bits.

15. The pipelined Viterbi decoder of claim 8, wherein the datastream is received from one of a wired communication medium and a wireless communication medium.

16. The pipelined Viterbi decoder of claim 8, wherein the encoded datastream exhibits at least one of: a discrete multi-tone (DMT) communication protocol, a carrierless AM/PM (CAP) communication protocol, a quadrature amplitude modulation (QAM) communication protocol, a quadrature phase amplitude modulation (QPAM) communication protocol, a code division multiple access (CDMA) communication protocol, a binary shift keying (BPSK) communication protocol, a quaternary phase shift keying (QPSK) communication protocol.

17. A method for error correction of a convolutionally encoded datastream received from a communication medium and the method comprising:
   determining branch and path metrics for the encoded datastream;
   tracing back in each of successive traceback intervals a single traceback path through the path metrics; and
   determining from each single traceback path correction factors for decoding at least two corresponding successive sub-symbols/symbols from the encoded datastream.

18. The method of claim 17, wherein the single traceback path exhibits a length expressed as:

$$N=hm+j$$

where m is a maximul memory order associated with encoding of the encoded datastream, h is a maximul memory order scale factor, and j is a number of sub-symbols/symbols that will be decoded from the single traceback path.

19. The method of claim 18, wherein further j is an integer fraction of N.

20. The method of claim 17, further comprising the act intermediate to the first determining and the tracing back acts of:
   buffering successive sets of path metrics for traceback in the act of tracing back.

21. The method of claim 17, further comprising:
   error correcting at least two corresponding successive sub-symbols/symbols from the encoded datastream with the correction factors from the second determining act; and
   demapping each error corrected sub-symbol/symbol from the act of error correcting to corresponding bits.

22. The method of claim 17, wherein the communication medium comprises one of a wired medium and a wireless medium.

23. The method of claim 17, wherein the encoded datastream exhibits at least one of: a discrete multi-tone (DMT) communication protocol, a carrierless AM/PM (CAP) communication protocol, a quadrature amplitude modulation (QAM) communication protocol, a quadrature phase amplitude modulation (QPAM) communication protocol, a code division multiple access (CDMA) communication protocol, a binary shift keying (BPSK) communication protocol, a quaternary phase shift keying (QPSK) communication protocol.

24. A method for decoding a multi-tone modulated datastream encoded with convolutional encoder with a maximul memory order "m", and the method comprising:
   determining from an input of a pair of tones in each of successive pipeline processing intervals a quantity m two-dimensional branch metrics;
   determining in each successive pipeline processing interval a quantity 2m four-dimensional branch metrics from the m two-dimensional branch metrics;
   determining in each successive pipeline processing interval a quantity $m^2$ path metrics from the 2m four-dimensional branch metrics; and
   repetitively tracing back through a succession of the path metrics to determine in each traceback interval correction factors for at least two corresponding ones of the tones.

25. The method for decoding of claim 24, wherein the act of repetitively tracing back further comprises:
   tracing back a single path through the path metrics; and
   determining correction factors from the single path at least two corresponding tones from the input datastream.

26. The method of claim 25, wherein the single path exhibits a length expressed as:

$$N=hm+j$$

where m is a maximul memory order associated with encoding of the encoded datastream, h is a maximul memory order scale factor, and j is a number of tones that will be decoded from the single path.

27. The method of claim 26, wherein further j is an integer fraction of N.

28. The method of claim 24, further comprising the act intermediate to the third determining and the tracing back acts of:
   buffering successive sets of path metrics for traceback in the act of tracing back.

29. The method of claim 24, further comprising:
   error correcting at least two corresponding tones from the encoded datastream with the correction factors from the act of repetitively tracing back; and
   demapping each error corrected sub-symbol/symbol from the act of error correcting to corresponding bits.

30. The method of claim 24, further comprising one of the acts of:
   receiving the datastream from a wired medium; and
   receiving the datastream from a wireless medium.

31. The method of claim 24, wherein the encoded datastream exhibits at least one of: a discrete multi-tone (DMT) communication protocol, a carrierless AM/PM (CAP) communication protocol, a quadrature amplitude modulation (QAM) communication protocol, a quadrature phase amplitude modulation (QPAM) communication protocol, a code division multiple access (CDMA) communication protocol, a binary shift keying (BPSK) communication protocol, a quaternary phase shift keying (QPSK) communication protocol.

* * * * *